United States Patent
Kobayashi et al.

(10) Patent No.: US 10,845,422 B2
(45) Date of Patent: Nov. 24, 2020

(54) ELECTRICITY STORAGE DEVICE TESTER

(71) Applicant: TOYOTA JIDOSHA KABUSHIKI KAISHA, Toyota (JP)

(72) Inventors: Kiwamu Kobayashi, Anjo (JP); Takeshi Goto, Kasugai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/414,864

(22) Filed: May 17, 2019

(65) Prior Publication Data

US 2020/0041575 A1    Feb. 6, 2020

(30) Foreign Application Priority Data

Aug. 1, 2018 (JP) ................................. 2018-145271

(51) Int. Cl.
*G01R 31/392* (2019.01)
(52) U.S. Cl.
CPC ................................. *G01R 31/392* (2019.01)
(58) Field of Classification Search
CPC .............................. G01R 33/09; G01R 33/093
USPC ..................... 324/701, 760.01, 200, 244, 252
See application file for complete search history.

(56) References Cited

U.S. PATENT DOCUMENTS

| | | | | |
|---|---|---|---|---|
| 7,504,840 B2* | 3/2009 | Arat | ................... | G01R 1/06733 324/755.05 |
| 2002/0017914 A1* | 2/2002 | Roggel | .............. | G01R 1/06738 324/754.2 |
| 2006/0022689 A1* | 2/2006 | Golden | .............. | G01R 31/2886 324/754.04 |
| 2015/0145524 A1* | 5/2015 | Duncan | .................. | G01R 31/50 324/538 |
| 2016/0054370 A1* | 2/2016 | Fomin | .................. | G01R 31/312 324/509 |
| 2016/0178689 A1* | 6/2016 | Okita | ..................... | G01R 31/50 324/509 |

FOREIGN PATENT DOCUMENTS

JP    2010-153275 A    7/2010

OTHER PUBLICATIONS

U.S. Appl. No. 16/182,683, filed Nov. 7, 2018 in the name of Kobayashi et al.

* cited by examiner

*Primary Examiner* — Giovanni Astacio-Oquendo
(74) *Attorney, Agent, or Firm* — Oliff PLC

(57) ABSTRACT

An electricity storage device tester including: a voltage application unit configured to apply to a circuit a direct-current voltage; an ammeter configured to acquire a current value of the circuit; a voltage control unit configured to control an output voltage of the voltage application unit; and a determination unit configured to determine whether the electricity storage device is defective or not based on the value acquired by the ammeter. The voltage application unit includes a plurality of power source devices connected in series with each other. One of the power source devices is a specific power source device which is configured to have a variable output voltage and of which both a maximum value and a step width of the output voltage are smaller than the power source devices other than the specific power source device.

4 Claims, 6 Drawing Sheets

COMPARATIVE EXAMPLE

ELECTRICITY STORAGE DEVICE TESTER

INCORPORATION BY REFERENCE

The disclosure of Japanese Patent Application No, 2018-145271 filed on Aug. 1, 2018 including the specification, drawings and abstract is incorporated herein by reference in its entirety.

BACKGROUND

1. Technical Field

The present disclosure relates to a tester that determines whether an electricity storage device is defective or not. More specifically, the present disclosure relates to an electricity storage device tester that can quickly make a defectiveness determination based on an amount of discharge current, not an amount of voltage decrease, of an electricity storage device.

2. Description of Related Art

Various proposals have been hitherto made of testing technology for determining whether secondary batteries and other electricity storage devices are defective or not. One example is Japanese Patent Application Publication No. 2010-153275, in which a let-stand step of letting a secondary battery to be determined stand in a pressurized state is performed, and the battery voltage is measured before and after the let-stand step. The difference between the battery voltages before and after the let-stand step is the amount of voltage decrease occurring while the battery is let stand. If the battery has a large amount of voltage decrease, this means that the amount of self-discharging of the battery is large. Thus, whether a secondary battery is defective or not can be determined based on whether the amount of voltage decrease is large or small.

SUMMARY

However, this conventional determination of defectiveness of a secondary battery has the following problems. One problem is that the defectiveness determination is time-consuming. The reason why the defectiveness determination is tune-consuming is that an amount of voltage decrease that can be deemed as significant cannot be reached unless the battery is let stand for a long time in the let-stand step. This is partly attributable to a contact resistance during voltage measurement. The voltage is measured with a measuring instrument connected across both terminals of the secondary battery. There is an unavoidable contact resistance between the terminals of the secondary battery and the terminals of the measuring instrument, and the measurement result is affected by this contact resistance. The contact resistance varies each time the terminals of the secondary battery and the terminals of the measuring instrument are connected to each other. Therefore, only when the amount of voltage decrease itself is considerably large can the variation in the contact resistance among measurements be disregarded.

Another problem is that the accuracy of voltage measurement itself is not very good either. For one thing, voltage measurement is inevitably affected by a voltage decrease occurring along a path of current application during measurement. For another, the terminals of the secondary battery and the terminals of the measuring instrument are connected to each other each time at slightly different contact points, which results in variation in the degree of voltage decrease among measurements. It is therefore conceivable to use current measurement instead of voltage measurement to thereby reduce the measurement time of the amount of self-discharging and increase the measurement accuracy. Unlike voltage measurement, current measurement is little affected by the contact point because the current is constant throughout the circuit. Nevertheless, simply substituting current measurement for voltage measurement cannot allow for an appropriate determination. The measurement result is influenced by variation in conditions, including a charge voltage of the secondary battery and the measurement environment.

The present disclosure provides an electricity storage device tester that can quickly determine whether an electricity storage device is defective or not regardless of variation in conditions.

An electricity storage device tester in an aspect of the present disclosure includes: a voltage application unit configured to apply to a circuit a direct-current voltage in an opposite direction from a voltage of an electricity storage device; an ammeter configured to acquire a current value of the circuit; a voltage control unit configured to control an output voltage of the voltage application unit; and a determination unit configured to determine whether the electricity storage device is defective or not based on the value acquired by the ammeter. The circuit includes the voltage application unit connected to the electricity storage device being tested. The voltage application unit includes a plurality of power source devices connected in series with each other. One of the power source devices is a specific power source device which is configured to have a output voltage that is variable, a maximum value of the output voltage of the specific power source device is smaller than maximum values of output voltages of the power source devices other than the specific power source device, and a step width of the output voltage of the specific power source device is smaller than step widths of the output voltages of the power source devices other than the specific power source device. The voltage control unit is configured to, when the voltage application unit applies a voltage to the circuit for the determination unit to make a determination, adjust the output voltage of the voltage application unit by manipulating the output voltage of the specific power source device.

The electricity storage device tester in the above aspect performs a test in a state where the voltage application unit is connected to an electricity storage device being tested to form a circuit. In the test, the voltage application unit applies to the circuit a direct-current voltage in the opposite direction from the voltage of the electricity storage device. The current value of the circuit in this state is acquired, and the determination unit determines whether the electricity storage device is defective or not based on the acquired value. During this process, the voltage control unit controls the output voltage of the voltage application unit so as to allow the test to be performed in a short test time. Here, the voltage application unit is formed by the power source devices connected in series with each other, and of these power source devices, the specific power source device of which both the maximum value and the step width of the output voltage are smaller than the other power source devices other than the specific power source device is a device that is manipulated to adjust the output voltage of the voltage application unit for the test. Thus, an appropriate test is performed without causing an excessive rise in the output voltage of the voltage application unit.

In the electricity storage device tester of the first aspect, the voltage control unit may be configured to, when the voltage application unit applies a voltage to the circuit for the determination unit to make a determination, perform feedback control of raising the output voltage of the voltage application unit based on a parasitic resistance value of the circuit and the current value of the circuit. The tester thus configured can cause the current value of the circuit to converge early and can test the electricity storage device for defectiveness based on the converged status.

In the electricity storage device tester of the first aspect, the voltage control unit may be configured to, when the voltage application unit applies the voltage to 1.5 the circuit for the determination unit to make the determination, raise the output voltage of the voltage application unit according to a parasitic resistance value of the circuit, within such a range that an absolute value of an imaginary resistance value remains below the parasitic resistance value of the circuit, the imaginary resistance value may be a negative value obtained by converting an increase in a current of the circuit resulting from raising the output voltage of the voltage application unit into a decrease in a parasitic resistance of the circuit. The tester thus configured can test an electricity storage device for defectiveness while preventing divergence of the circuit current.

In the electricity storage device tester of the first aspect, the step width of the output voltage of the specific power source device may be equal to or smaller than 10 µV.

Having these configurations, the electricity storage device testers provided can quickly determine whether an electricity storage device is defective or not regardless of variation in conditions.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
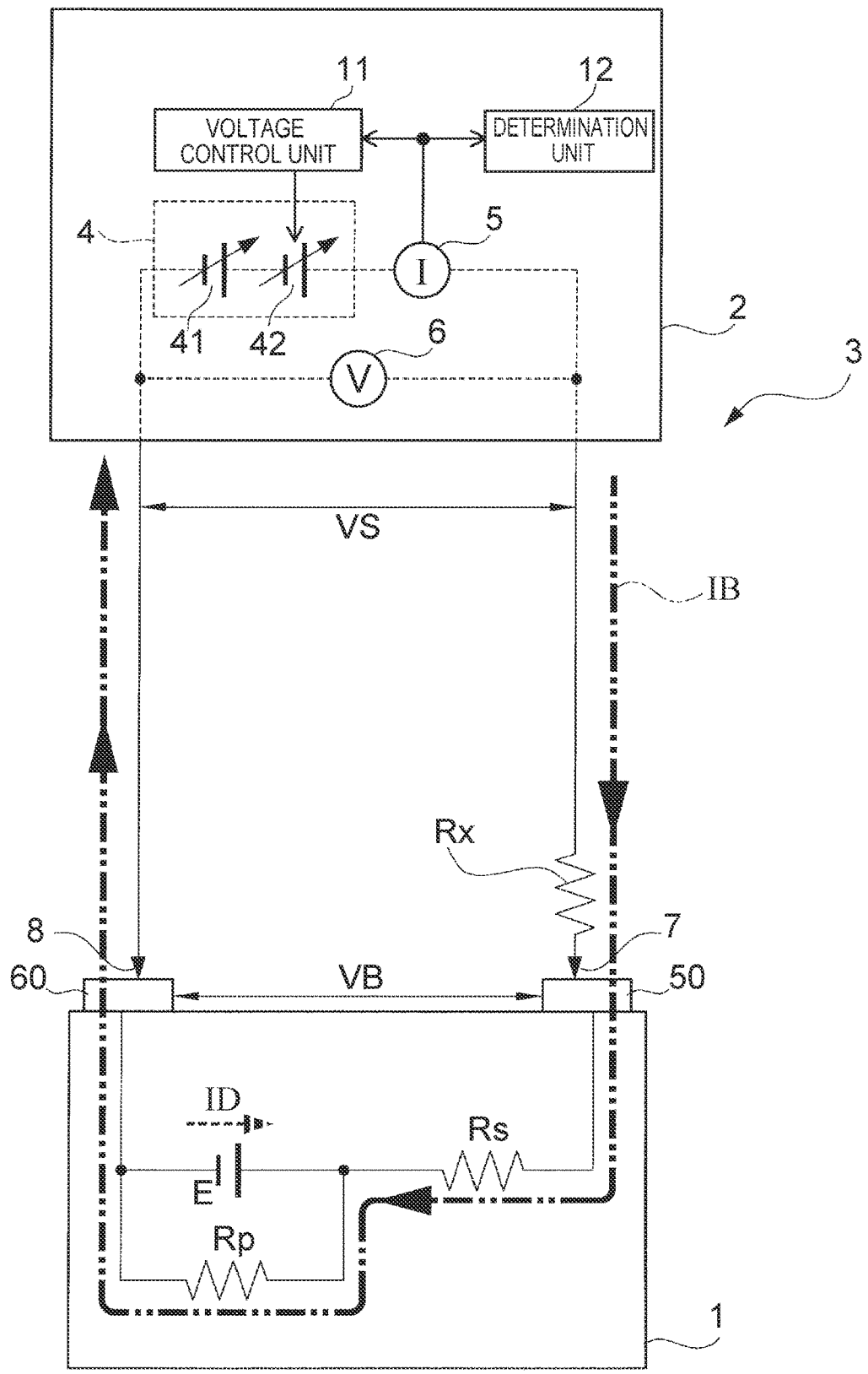
FIG. 1 is a circuit diagram showing a secondary battery tester of an embodiment, including a secondary battery being tested.

In the following, an embodiment that embodies the present disclosure will be described in detail with reference to the accompanying drawings. An electricity storage device tester 2 of the embodiment is configured as shown in FIG. 1. FIG. 1 includes a secondary battery 1 that is an electricity storage device being tested. A test of the secondary battery 1 using the tester 2 is performed with the tester 2 connected to the secondary battery 1 to form a circuit 3. First, the configuration of the tester 2 will be described.

The tester 2 has a voltage application unit 4, an ammeter 5, a voltmeter 6, and probes 7, 8. The ammeter 5 is disposed in series with the voltage application unit 4, and the voltmeter 6 is disposed in parallel to the voltage application unit 4. The output voltage of the voltage application unit 4 is variable. The output voltage of the voltage application unit 4 constitutes an output voltage VS of the tester 2, and is applied to the secondary battery 1 through the circuit 3 as will be described later. The ammeter 5 measures a current flowing through the circuit 3. The voltmeter 6 measures a voltage across the probes 7, 8. In FIG. 1, the probes 7, 8 of the tester 2 are connected to terminals 50, 60 of the secondary battery 1 to form the circuit 3.

The voltage application unit 4 in the tester 2 is formed by a first direct-current power source device 41 and a second direct-current power source device 42 connected in series with each other. Both these power source devices are variable power source devices of which the output voltage is variable. Each of the first direct-current power source device 41 and the second direct-current power source device 42 may be a device that has a built-in power generation function and outputs a direct-current voltage, or may be a device that is supplied with electricity from outside and converts the electricity as appropriate to output the electricity as a direct-current voltage. The division of roles between the first direct-current power source device 41 and the second direct-current power source device 42 will be described later.

The tester 2 is further provided with a voltage control unit 11 and a determination unit 12. The voltage control unit 11 controls the output voltage of the voltage application unit 4. The determination unit 12 determines whether the secondary battery 1 is defective or not based on a measurement value of the ammeter 5. The functions of the voltage control unit 11 and the determination unit 12 will be described in detail later.

Basic Principle

The basic principle of a test of the secondary battery 1 using the tester 2 will be described. In FIG. 1, the secondary battery 1 is schematically shown. The secondary battery 1 in FIG. 1 is represented as a model composed of an electromotive element E, an internal resistance Rs, and a short-circuit resistance Rp. The internal resistance Rs is disposed in series with the electromotive element E. The short-circuit resistance Rp is a model of a conductive path formed by small metallic foreign bodies that can sometimes enter an electrode stack 20, and is disposed in parallel to the electromotive element E.

In addition, a parasitic resistance Rx is present in the circuit 3 of FIG. 1. The parasitic resistance Rx is mainly a conductor resistance at each part of the tester 2. It is merely for the convenience of depiction that the parasitic resistance Rx is depicted in FIG. 1 as if being present only in a conductor on the side of the probe 7. In reality, the parasitic resistance Rx is present throughout the entire circuit 3.

In the test using the tester 2, it is tested whether the amount of self-discharging of the secondary battery 1 is large or small. The secondary battery 1 is defective if the amount of self-discharging is large and not defective if the amount of self-discharging is small. For this purpose, first, the secondary battery 1 is charged before being connected to the circuit 3. Then, the charged secondary battery 1 is connected to the circuit 3, and in this state, the amount of self-discharging of the secondary battery 1 is calculated by the tester 2. Based on the calculation result, it is determined whether the secondary battery 1 is defective or not.

Specifically, the charged secondary battery 1 is connected to the circuit 3. Here, it is assumed that the charged secondary battery 1 to be connected to the circuit 3 is one for which high-temperature aging that is usually performed after charging has been completed and of which the battery voltage has stabilized. However, the test in this embodiment itself is performed at room temperature. A battery voltage VB of the secondary battery 1 upon completion of charging and high-temperature aging is measured. This measured value is an initial battery voltage VB1. Next, the output voltage VS of the tester 2 is adjusted so as to match the initial battery voltage VB1. Then, the secondary battery 1 is connected to the circuit 3. The output voltage VS at this point matches the initial battery voltage VB1 of the secondary battery 1.

In this state, the output voltage VS matches the initial battery voltage VB1 and the output voltage VS and the battery voltage VB of the secondary battery 1 are in opposite directions. Thus, these voltages cancel each other, resulting in a zero circuit current IB of the circuit 3. The secondary battery 1 is then let stand with the output voltage VS of the tester 2 maintained to be constant at the initial battery voltage VB1.

Figure 2:
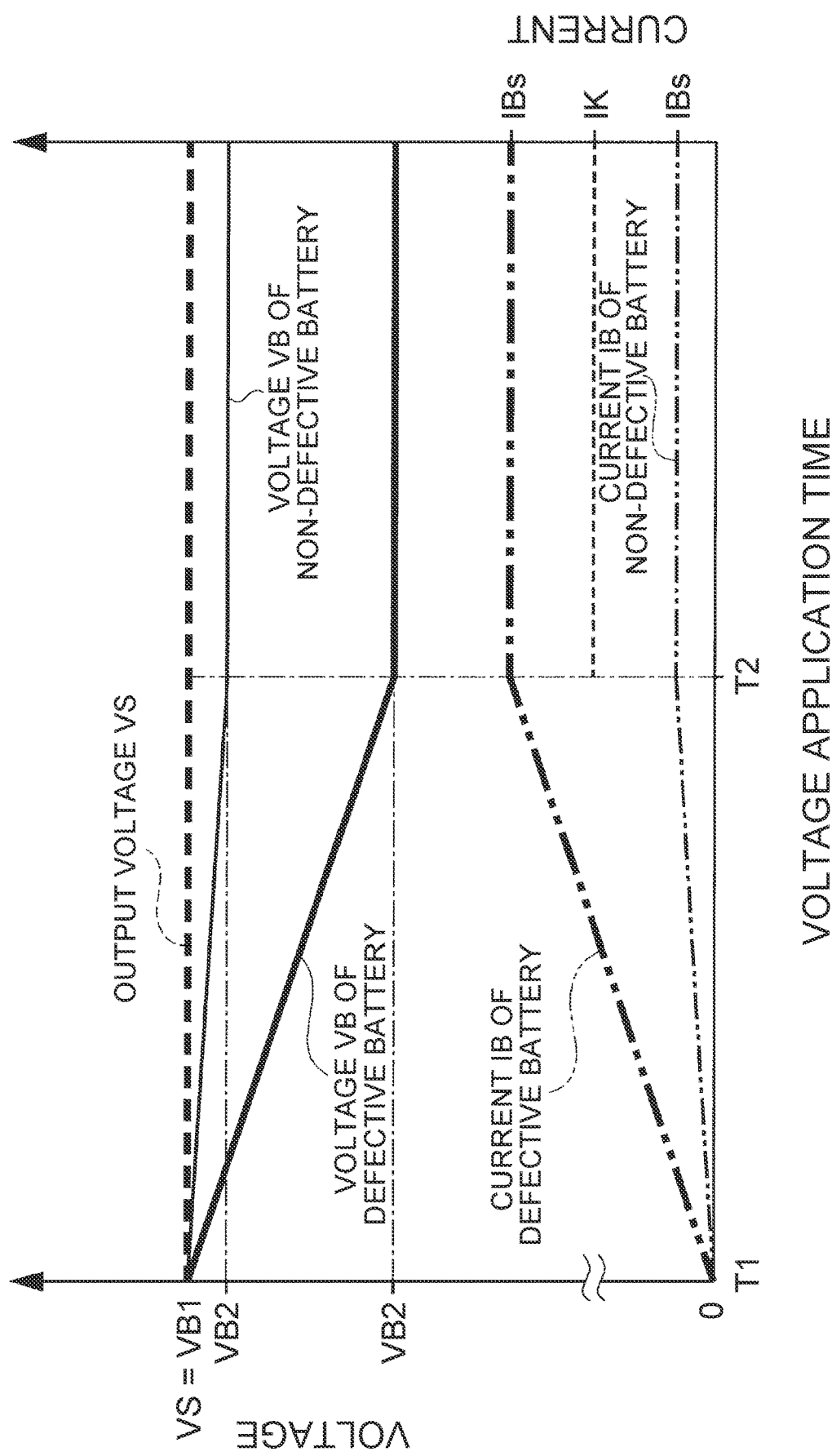
FIG. 2 is a graph showing changes over time in voltage and current according to the basic principle of a test.

FIG. 2 shows a subsequent status of the circuit 3. In FIG. 2, the horizontal axis shows the time and the vertical axes show the voltage (left side) and the current (right side). As to the time on the horizontal axis, time at the left end of FIG. 2 is time at which application of the output voltage VS equal to the initial battery voltage VB1 as described above is started. After time T1, the battery voltage VB decreases gradually from the initial battery voltage VB1 due to self-discharging of the secondary battery 1. Thus, the balance between the output voltage VS and the battery voltage VB is lost and the circuit current IB starts to flow through the circuit 3. The circuit current IB increases gradually from zero. The circuit current IB is directly measured by the ammeter 5. When time T2 later than tune T1 is reached, both the decrease in the battery voltage VB and the increase in the circuit current IB level off, and subsequently both the battery voltage VB and the circuit current IB remain constant (VB2, IBs).

As is clear from FIG. 2, both the increase in the circuit current TB and the decrease in the battery voltage VB are more rapid in a defective secondary battery 1 than in a non-defective secondary battery 1. Accordingly, the circuit current IBs of the defective secondary battery 1 upon convergence is higher than the circuit current IBs of the non-defective secondary battery 1 upon convergence. The battery voltage VB2 of the defective secondary battery 1 upon convergence is lower than the battery voltage VB2 of the non-defective secondary battery 1 upon convergence.

The reason why the circuit 3 after time T1 assumes the status as shown in FIG. 2 will be described. First, the battery voltage VB decreases due to self-discharging of the secondary battery 1 as described above. As a result of self-discharging, a self-discharge current ID flows through the electromotive element E of the secondary battery 1. The self-discharge current ID is high when the amount of self-discharging of the secondary battery 1 is large and low when the amount of self-discharging is small. In the secondary battery 1 in which the value of the short-circuit resistance Rp is small, the self-discharge current ID tends to be high.

On the other hand, the circuit current IB that starts to flow as the battery voltage VB decreases after time T1 is a current in a direction in which the secondary battery 1 is charged. Thus, the circuit current IB acts in a direction in which self-discharging of the secondary battery 1 is inhibited, and this direction is the opposite direction from the self-discharge current ID inside the secondary battery 1. When the circuit current IB increases to be equal to the self-discharge current ID, self-discharging virtually stops. This is at time T2. Subsequently, therefore, both the battery voltage VB and the circuit current IB remain constant (VB2, IBs). Whether the circuit current IB has converged or not can be determined by a known technique. For example, the value of the circuit current IB can be sampled at an appropriate frequency, and the circuit current IB can be determined to have converged when a change in the value has become smaller than a predetermined reference.

Here, the circuit current IB can be directly ascertained as a reading of the ammeter 5 as described above. Therefore, by setting a reference value IK for the circuit current IBs upon convergence in the determination unit 12, it is possible to determine whether the secondary battery 1 is defective or not. If the circuit current IBs upon convergence is higher than the reference value IK, this means that the secondary battery 1 is a defective product having a large amount of self-discharging, whereas if the circuit current IBs is lower than the reference value IK, this means that the secondary battery 1 is a non-defective product having a small amount of self-discharging.

Thus, the determination unit 12 stores the reference value IK. By comparing the circuit current IBs upon convergence with the reference value IK, the determination unit 12 makes the above-described defectiveness determination. Here, it is not absolutely essential to acquire an accurate value of the circuit current IBs upon convergence. If whether the circuit current IBs upon convergence will exceed the reference value IK or not becomes clear in the course of measurement of the circuit current IB, the determination may be made at that point. Instead of the reference value IK for the circuit current IBs upon convergence, a reference value for the time taken for the circuit current IB to converge may be set. If the circuit current IB converges before the reference value for the time is reached, the secondary battery 1 can be determined as a non-defective product. If the reference value for the time is reached without the circuit current IB having converged, the secondary battery 1 can be determined as a defective product. For this purpose, an algorithm that determines whether the circuit current IB has converged or not is required, and a publicly known algorithm can be used as such an algorithm.

The processing time required for this test technique (from time T1 to time T2) is shorter than the let-stand time in the technique described in BACKGROUND. Moreover, since this test technique is based on current measurement, the determination accuracy is higher. Determining defectiveness based on the battery voltage VB2 upon convergence in FIG. 2 is not a very preferred means. This is because the battery voltage VB does not always accurately appear as a reading of the voltmeter 6. Here concludes the description of the basic principle of the test of the secondary battery 1 using the tester 2.

Raising Output Voltage VS

The foregoing description assumes that the output voltage VS of the tester 2 is constant. However, the output voltage VS does not have to be constant. On the contrary, appropriately changing the output voltage VS under the control of the voltage control unit 11 can further reduce the processing time required for determination. This will be described below.

Figure 3:
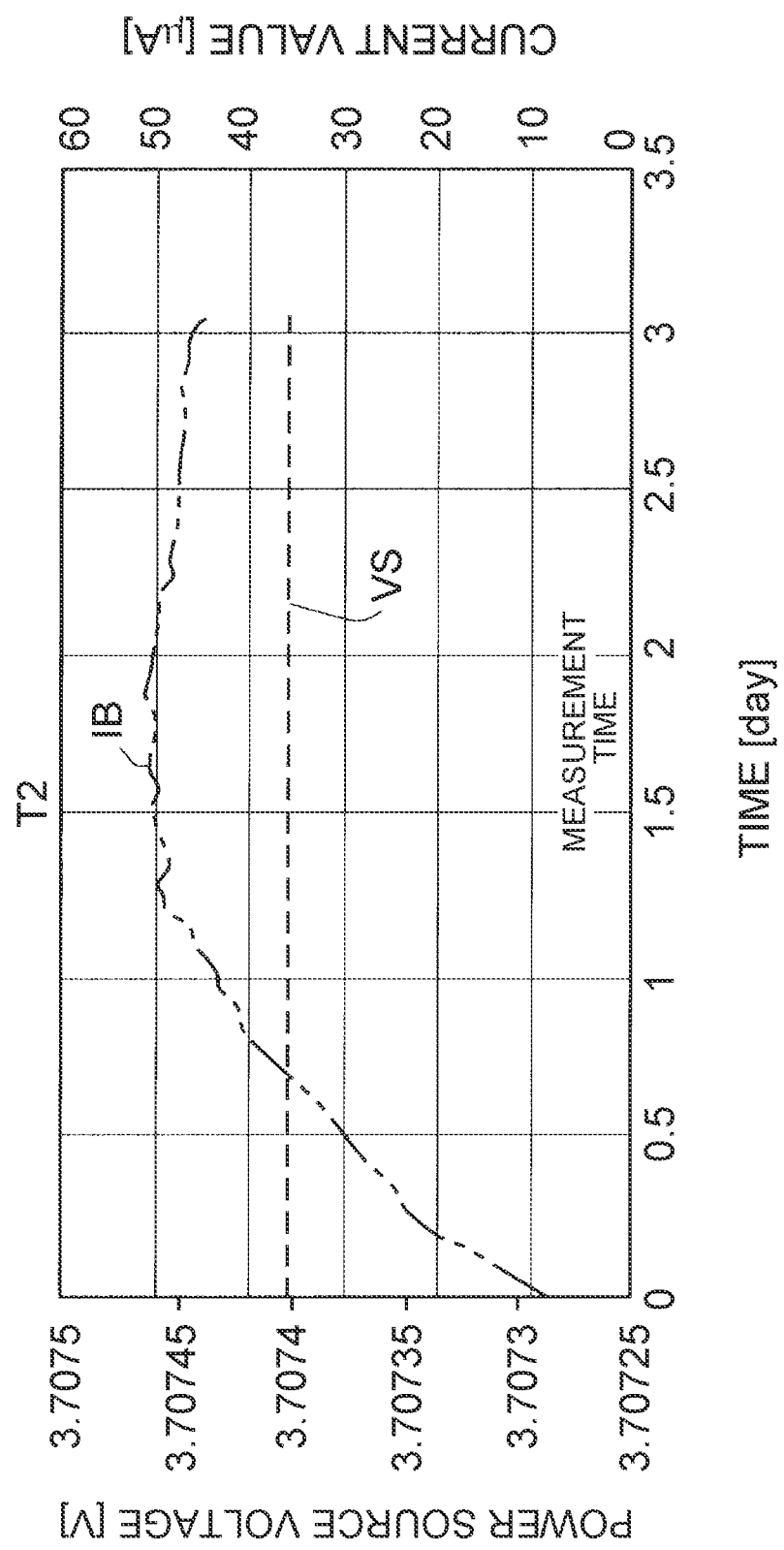
FIG. 3 is a graph showing an example of a shift of a circuit current in a case where an output voltage is held constant.
Figure 4:
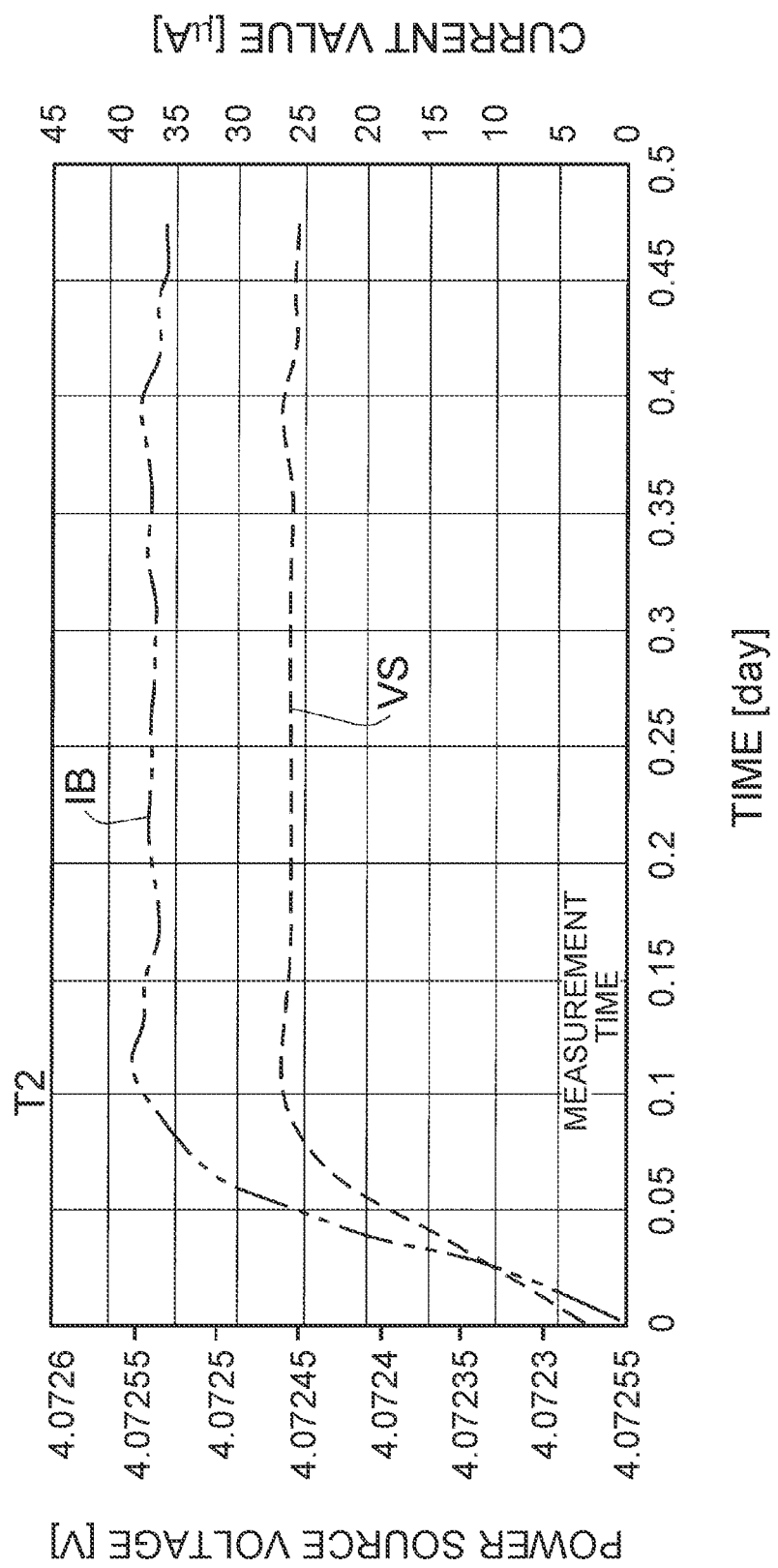
FIG. 4 is a graph showing an example of a shift of a circuit current in a case where an output voltage is increased.

Advantages of changing the output voltage VS will be demonstrated by using FIG. 3 and FIG. 4. FIG. 3 shows an example of a shift of the actual circuit current IB in the case where the output voltage VS is held constant as described above. In the example of FIG. 3, the output voltage VS is held constant at the initially set value, and it takes about 1.5 days for the circuit current IB to converge (time T2). The example of FIG. 3 is an example of measurement under the following conditions:

Battery capacity: 4 Ah
Positive-electrode active material: Ternary lithium compound
Negative-electrode active material: Graphite
Environmental temperature: 25° C.

While 1.5 days in FIG. 3 are sufficiently short compared with the time taken for the determination based on voltage measurement, changing the output voltage VS can further reduce the required processing time. FIG. 4 shows an example for this case. In the example of FIG. 4, the output voltage VS is raised, and the circuit current IB converges in only 0.1 days. While the same measurement conditions as in the case of FIG. 3 are used in the example of FIG. 4, due to the difference between the individual secondary batteries 1 being measured, the initial value of the output voltage VS and the circuit current IB (IBs) upon convergence in the example of FIG. 4 do not match those in the example of FIG. 3. The example of measurement in FIG. 4 deals with a non-defective secondary battery 1. A defective secondary battery 1 would have a higher circuit current IB (IBs) upon convergence.

The case where the output voltage VS is raised as in FIG. 4 will be further described. First, the circuit current IB in the circuit 3 of FIG. 1 is given by the following Formula (1) from the output voltage VS of the tester 2, the battery voltage VB, and the parasitic resistance Rx:

$$IB=(VS-VB)/Rx \qquad (1)$$

Here, if the output voltage VS is held constant, the circuit current IB increases as the battery voltage VB decreases due to self-discharging of the secondary battery 1 as described above. When the circuit current IB increases to be equal to the self-discharge current ID, discharging of the secondary battery 1 virtually stops. As a result, subsequently both the battery voltage VB and the circuit current IB remain constant (VB2, IBs) as described above. Thus, the circuit current IBs upon convergence indicates the self-discharge current ID of the electromotive element E of the secondary battery 1.

The same Formula (1) holds true also in the case where the output voltage VS is raised. However, with the rise in the output voltage VS, the circuit current IB increases more quickly than in the case where the output voltage VS is constant. Accordingly, the time taken for the circuit current IB to become equal to the self-discharge current ID is shorter. This is why the circuit current IB converges earlier as described above. However, thoughtlessly raising the output voltage VS may result in an excessive rise. In that case, the circuit current IB will not appropriately converge, making the determination impossible. It is therefore necessary to impose a restriction on how much to raise the output voltage VS. Specifically, in this embodiment, the output voltage VS is raised within such a range that the parasitic resistance Rx in Formula (1) is seemingly reduced. This is because when the parasitic resistance Rx is reduced, the circuit current IB is increased accordingly.

Figure 5:
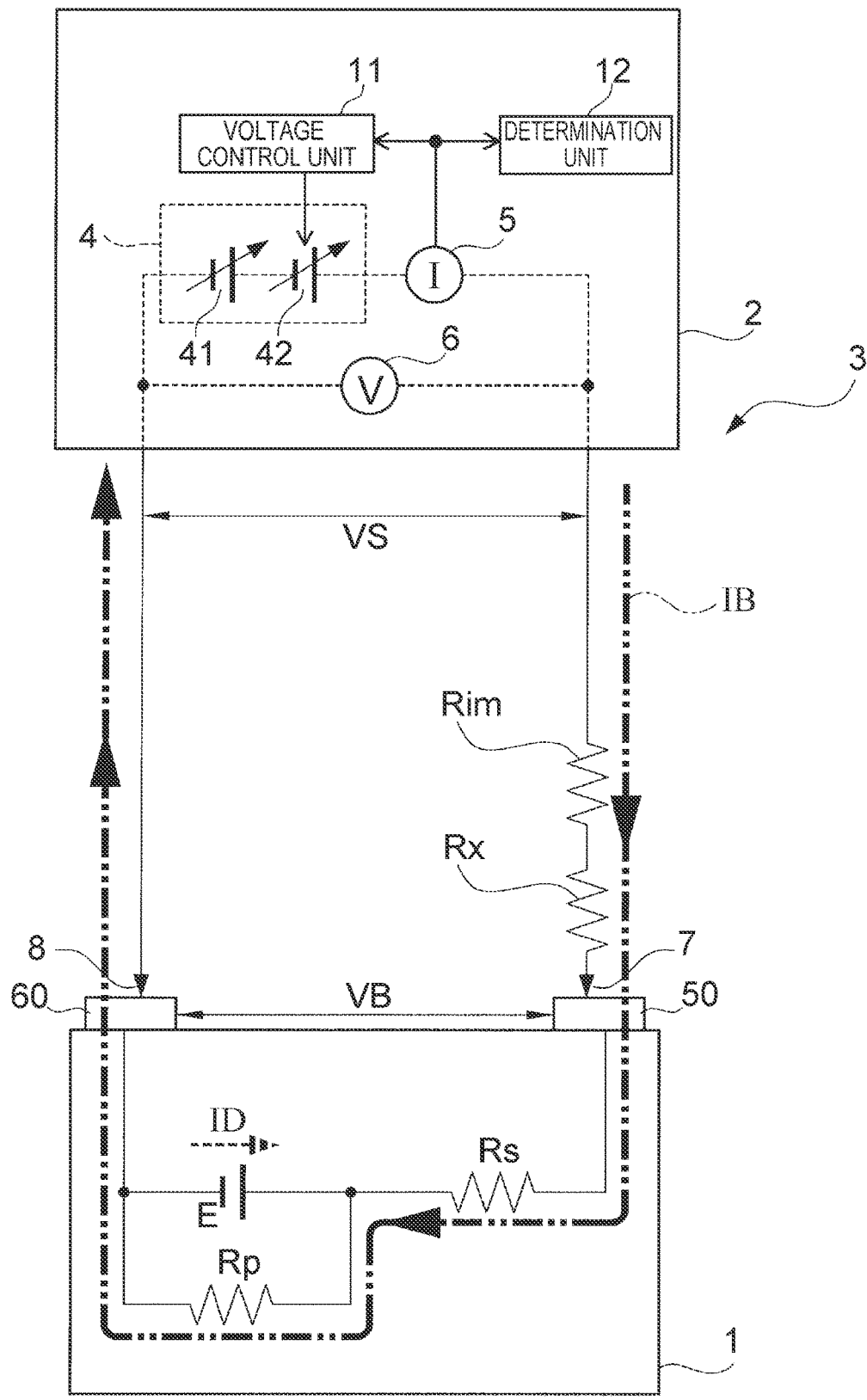
FIG. 5 is a circuit diagram in which an imaginary resistance is incorporated.

Therefore, this embodiment introduces the concept of an imaginary resistance Rim as shown in FIG. 5. The imaginary resistance Rim is an imaginary resistance having a negative or zero resistance value. In the circuit diagram of FIG. 5, the imaginary resistance Rim is inserted in series with the parasitic resistance Rx. Although such a resistance does not exist in reality, the idea is to consider the status of the rising output voltage VS by using, as a substitute for that status, a model in which the output voltage VS is held constant and instead the absolute value of the resistance value of the imaginary resistance Rim is increased. The sum of the parasitic resistance Rx and the imaginary resistance Rim decreases but must remain positive. Hereinafter, the sum of the parasitic resistance Rx and the imaginary resistance Rim will be referred to as a pseudo-parasitic resistance Ry. The circuit current in the model incorporating the pseudo-parasitic resistance Ry is expressed by the following Formula (2):

$$IB=(VS-VB)/(Rx+Rim) \qquad (2)$$

It is assumed here that the parasitic resistance Rx is 5Ω. Then, the circuit current IB varies between a case where the imaginary resistance Rim is 0Ω and a case where the imaginary resistance Rim is −4Ω. Specifically, from Formula (2), the circuit current IB in the case where the imaginary resistance Rim is −4Ω (corresponding to that after the start of measurement) is five times as high as the circuit current IB in the case where the imaginary resistance Rim is 0Ω (corresponding to that at the start of measurement). This is because the pseudo-parasitic resistance Ry (=Rx+Rim) in the former case is a fifth of that in the latter case.

The above Formula (2) can be transformed into the following Formula (3):

$$VS=VB+(Rx+Rim)*IB \qquad (3)$$

Formula (3) shows that adding the product of the pseudo-parasitic resistance Ry and the circuit current IB to the battery voltage VB yields the output voltage VS. Since the imaginary resistance Rim constituting part of the pseudo-parasitic resistance Ry does not exist in reality as described above, the output voltage VS is raised to the voltage obtained by adding the product of the parasitic resistance Rx and the circuit current IB to the battery voltage VB so as to satisfy Formula (3). Thus, a value obtained by dividing the rise in the output voltage VS by the circuit current IB corresponds to the absolute value of the imaginary resistance Rim. The value of the parasitic resistance Rx may be a known value that is measured in advance for each tester 2 and stored in the voltage control unit 11.

When measurement is started with the output voltage VS matching the initial battery voltage VB1 as described above, the output voltage VS is raised based on Formula (3) at an appropriate frequency according to the circuit current IB at each time. For example, the frequency of raising the output voltage VS is about once per second. This frequency need not be constant. Thus, the larger the increase in the circuit current IB after the start of the test, the larger the rise in the output voltage VS. When the increase in the circuit current IB converges, the rise in the output voltage VS also converges. In this way, the measurement as shown in FIG. 4 can be realized. Hereinafter, thus raising the output voltage VS based on the values of the parasitic resistance Rx and the circuit current IB will be referred to as feedback. The feedback is included in the control function of the voltage control unit 11.

The rise in the output voltage VS relative to the increase in the circuit current IB is a product of the parasitic resistance Rx and the circuit current IB based on the above description. Therefore, when the rise in the output voltage VS is represented by ΔVS, the rise ΔVS is given by the following Formula (4):

$$\Delta VS=Rx*IB \qquad (4)$$

However, the rise ΔVS is not limited to this example, and may instead be a value obtained by multiplying the product of Formula (4) by a positive coefficient K that is smaller than one. The specific value of the coefficient K can be arbitrarily set within the above-described range and can be determined in advance. Thus, the rise ΔVS may be calculated by the following Formula (5):

$$\Delta VS = K * Rx * IB \quad (5)$$

Alternatively, the product of the coefficient K and the parasitic resistance Rx may be obtained as a constant M in advance, and the circuit current IB may be multiplied by the constant M to thereby calculate the rise ΔVS in the output voltage VS. In this case, the output voltage VS during the test is calculated by the following Formula (6):

$$VS = VB + M * IB \quad (6)$$

Details of Voltage Application Unit 4

The various calculations for raising the output voltage VS as described above are of course performed in the voltage control unit 11. In accordance with the result of the calculations, the voltage control unit 11 controls the voltage application unit 4 so as to raise the output voltage VS. As described above, the voltage application unit 4 is composed of the first direct-current power source device 41 and the second direct-current power source device 42 connected in series with each other. The voltage application unit 4 will be described in detail below.

The first direct-current power source device 41 and the second direct-current power source device 42 differ from each other in the maximum value and the step width of the output voltage. The first direct-current power source device 41 is a high-output power source device of which both the maximum value and the step width of the output voltage are large. On the other hand, the second direct-current power source device 42 is a high-accuracy power source device of which both the maximum value and the step width of the output voltage are small. When raising the output voltage VS as described above, the voltage control unit 11 raises the output voltage of the second direct-current power source device 42 while fixing the output voltage of the first direct-current power source device 41. Thus, the voltage control unit 11 controls the output voltage VS with higher accuracy.

The reason for performing such control lies in the voltage accuracy required in raising the output voltage VS. If the rise ΔVS in the output voltage VS is too large, the absolute value of the imaginary resistance Rim becomes equal to or higher than the parasitic resistance Rx. This will make the pseudo-parasitic resistance Ry zero or negative. In that case, the circuit current IB will diverge instead of converging, making the defectiveness determination of the secondary battery 1 impossible. On the other hand, to meet the need for speeding up the determination, it is advantageous to raise the output voltage VS as much as possible within such a range that the pseudo-parasitic resistance Ry remains positive.

The output voltage VS can be raised through manipulation of the output voltage of either the first direct-current power source device 41 or the second direct-current power source device 42. Here, if the output voltage VS is to be raised by using the first direct-current power source device 41 having a large step width, manipulating the output voltage thereof by just one step may result in an excessive rise ΔVS. However, if raising the output voltage VS is avoided because of that risk, sufficient speeding up of the determination cannot be achieved. On the other hand, such a risk is lower with manipulating the second direct-current power source device 42 having a small step width. Thus, it is desirable that the step width of the output voltage of the second direct-current power source device 42 be 10 μV or smaller.

In this embodiment, therefore, the output voltage of the first direct-current power source device 41 is fixed at an early stage before the output voltage VS is raised, and the subsequent rise ΔVS is realized through manipulation of the second direct-current power source device 42. Thus, the output voltage VS can be raised as much as possible within such a range that the pseudo-parasitic resistance Ry remains positive. The voltage varying function of the first direct-current power source device 41 is used when the battery type of the secondary battery 1 to be tested is changed.

In the following, an example and a comparative example of the voltage application unit 4 in the case where the type of the secondary battery 1 was a lithium-ion secondary battery and the battery voltage VB was about 3 V to 4.5 V (depending on the charged state) will be shown. The same conditions as in the preceding description of FIG. 3 and FIG. 4 were used, with the initial battery voltage VB1 set to 4.0 [V].

Example

First direct-current power source device 41:

| Maximum output voltage | 10 [V] |
|---|---|
| Step width | 180 [μV] |
| Initial output voltage | 4.0 [V] (fixed) |

Second direct-current power source device 42:

| Maximum output voltage | 10 [mV] |
|---|---|
| Step width | 10 [μV] |
| Initial output voltage | 270 [μV] |

Figure 6:
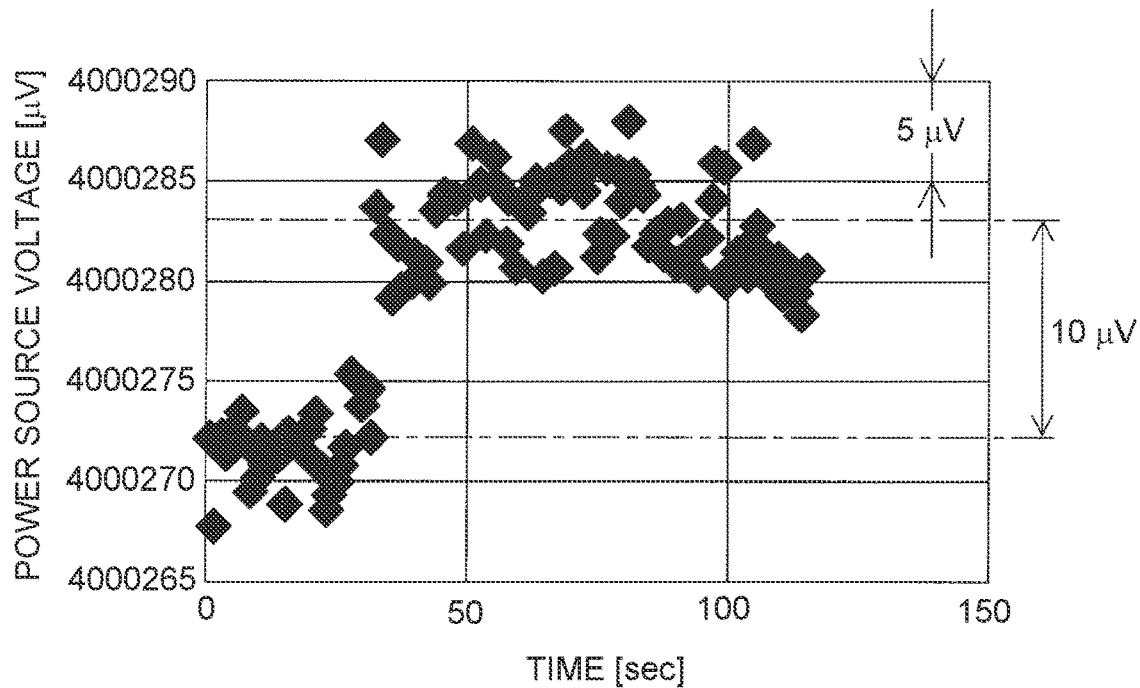
FIG. 6 is a graph showing a status of a voltage value when an output voltage VS is raised by one step in an example.

As shown in FIG. 6, this example can take advantage of the small step width of the second direct-current power source device 42. FIG. 6 plots readings (once/second) of the voltmeter 6 over a period from before to after the output voltage of the second direct-current power source device 42 was raised by one step while the output voltage of the first direct-current power source device 41 was fixed. It can be seen that the rise ΔVS of as small as 10 [μV] is realized, although there is some variation intrinsic to actually measured values.

Comparative Example

Figure 7:
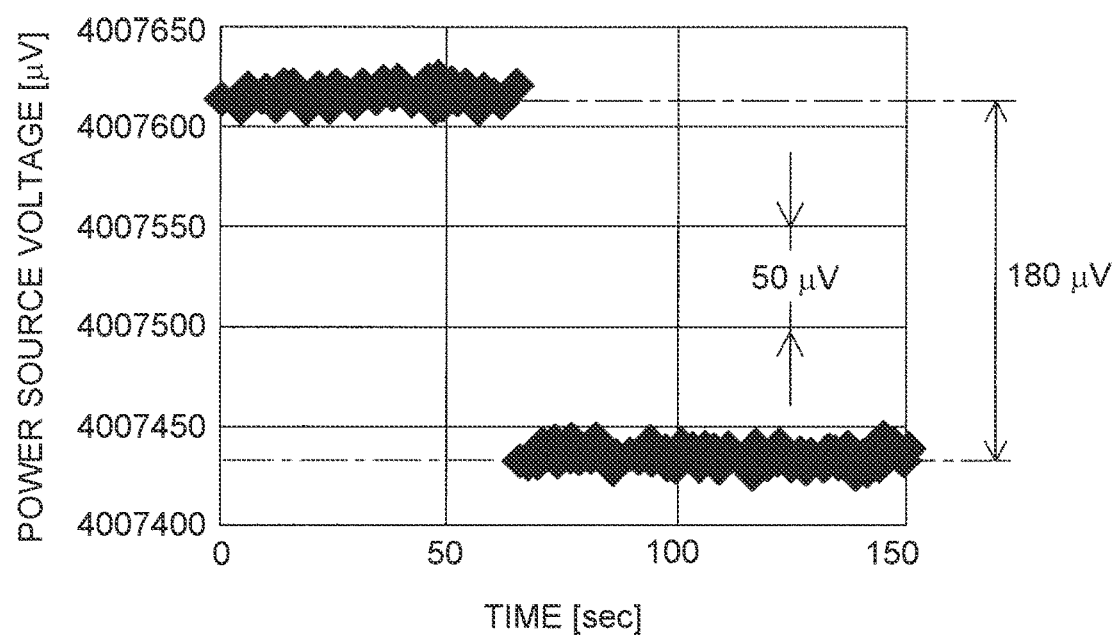
FIG. 7 is a graph showing a status of a voltage value when the output voltage VS is reduced by one step in a comparative example.

In the comparative example, by contrast, the voltage application unit 4 did not have a series-connection configuration and was composed of a single power source device that was the same as the first direct-current power source device 41. Thus, as shown in FIG. 7, the measurement was performed with the large step width of the first direct-current power source device 41. FIG. 7 plots readings (once/second) of the voltmeter 6 during a period from before to after the output voltage of the first direct-current power source device 41 was reduced by one step. During the measurement, it was determined that raising the output voltage of the first direct-current power source device 41 by one step might cause divergence of the circuit current IB. Therefore, FIG. 7 shows the step width obtained in an experiment in which the output voltage was reduced instead of being raised. It is worth noting that the scale on the vertical axis (voltage) differs between FIG. 6 and FIG. 7.

As has been described in detail above, in the embodiment and the example, the tester that tests whether the amount of self-discharging of the secondary battery 1 is large or small based on current measurement has remarkably improved accuracy in applying a direct-current voltage to the secondary battery 1 for the test. This is achieved by adjusting the voltage, as described above, through manipulation of the second direct-current power source device 42 that has a low maximum output voltage and also a small step width. The ratio of the maximum output voltage to the step width of the second direct-current power source device 42 is about 1000 to 1, and thus a commonly available model of power source device can sufficiently serve the purpose.

If a single power source device is to be used for voltage adjustment, the power source device to be used need be one that has both the high maximum output voltage of the first direct-current power source device 41 and the small step width of the second direct-current power source device 42. This would make the aforementioned ratio as high as a million to one, which is far from realistic for a commonly available model of power source device. Obviously, such a ratio is not achieved in the above-described comparative example. In the embodiment, this is achieved by forming the voltage application unit 4 by the direct-current power source devices of different models connected in series with each other. Thus, the electricity storage device tester 2 is realized that can quickly determine whether an electricity storage device is defective or not regardless of variation in conditions.

The above embodiment merely illustrates and in no way restricts the present disclosure. It should therefore be understood that various improvements and modifications can be made to the present disclosure within the scope of the gist thereof. For example, the number of the direct-current power source devices in the voltage application unit 4, which has been two in the above embodiment, may instead be three or larger. Of the direct-current power source devices in the voltage application unit 4, those devices other than the second direct-current power source device 42 that is used for voltage adjustment may be devices which do not have the voltage varying function and of which the voltage is fixed. However, this is disadvantageous in terms of adapting to various types of batteries. The rated voltage of the direct-current power source devices having a fixed voltage in this case can be regarded as the maximum value and the step width of the output voltage. The second direct-current power source device 42 may be disposed in the opposite direction from the other direct-current power source devices. In this case, the output voltage of the second direct-current power source device 42 is reduced to raise the output voltage VS of the voltage application unit 4.

How to apply the output voltage VS during the test is not limited to the above-described aspect of raising the output voltage VS from the voltage matching the initial battery voltage VB1. As another aspect, it is also possible to set the initial voltage VSI of the output voltage VS to be higher than the initial battery voltage VB1. The voltmeter 6 in FIG. 1 is not essential. While the voltmeter 6 is also depicted in FIG. 1 for the convenience of describing the basic operation principle, the operation of the tester 2 is possible without the voltmeter 6. Although this has not been particularly mentioned in the above embodiment, including the contact resistance of the probes 7, 8 in the parasitic resistance Rx of the circuit 3 can further reduce the test time. However, the contact resistance needs to be measured each time. For this measurement, the voltmeter 6 is preferably provided. Also when performing feedback control with the contact resistance of the probes 7, 8 taken into account, it is possible to take advantage of the small step width of the second direct-current power source device 42 to sufficiently produce the same effect.

The tester 2 of the embodiment can be used to test not only secondary batteries that have just been manufactured as new products, but also secondary batteries that are used products, for example, for the purpose of a remanufacturing process of a used battery pack. Moreover, electricity storage devices to be determined are not limited to secondary batteries but may also be capacitors, such as electric double layer capacitors and lithium-ion capacitors.

What is claimed is:

1. An electricity storage device tester comprising:
a plurality of power source devices configured to apply to a circuit a direct-current voltage in an opposite direction from a voltage of an electricity storage device, the circuit including the plurality of power source devices connected to the electricity storage device being tested;
an ammeter configured to acquire a current value of the circuit, wherein
a determination is made as to whether the electricity storage device is defective or not based on the current value acquired by the ammeter,
each of the plurality of power source devices is connected in series with each other,
one of the power source devices is a specific power source device which is configured to have an output voltage that is variable, a maximum value of the output voltage of the specific power source device is smaller than maximum values of output voltages of the power source devices other than the specific power source device, and a step width of the output voltage of the specific power source device is smaller than step widths of the output voltages of the power source devices other than the specific power source device, and
when the plurality of power source devices applies a voltage to the circuit for the determination to be made, the output voltage of the plurality of power source devices is adjusted by manipulating the output voltage of the specific power source device.

2. The electricity storage device tester according to claim 1, wherein when the plurality of power sources devices applies the voltage to the circuit for the determination to be made, feedback control is performed of raising the output voltage of the plurality of power source devices based on a parasitic resistance value of the circuit and the current value of the circuit.

3. The electricity storage device tester according to claim 1, wherein when the plurality of power source devices applies the voltage to the circuit for the determination to be made, the output voltage of the plurality of power source devices is raised according to a parasitic resistance value of the circuit, within such a range that an absolute value of an imaginary resistance value remains below the parasitic resistance value of the circuit, the imaginary resistance value is a negative value obtained by converting an increase in a current of the circuit resulting from raising the output voltage of the plurality of power source devices into a decrease in a parasitic resistance of the circuit.

4. The electricity storage device tester according to claim 1, wherein the step width of the output voltage of the specific power source device is equal to or smaller than 10 μV.

* * * * *